United States Patent
Farkas et al.

(10) Patent No.: US 9,326,371 B2
(45) Date of Patent: Apr. 26, 2016

(54) SYSTEM AND METHOD FOR STUB TUNING IN AN INFORMATION HANDLING SYSTEM

(75) Inventors: Sandor T. Farkas, Round Rock, TX (US); Girish K. Singh, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 2359 days.

(21) Appl. No.: 12/207,897

(22) Filed: Sep. 10, 2008

(65) Prior Publication Data

US 2010/0064180 A1 Mar. 11, 2010

(51) Int. Cl.
| | |
|---|---|
| *H05K 1/11* | (2006.01) |
| *H05K 1/02* | (2006.01) |
| *H05K 3/42* | (2006.01) |

(52) U.S. Cl.
CPC .............. *H05K 1/0251* (2013.01); *H05K 1/115* (2013.01); *H05K 3/429* (2013.01); *H05K 2201/09781* (2013.01)

(58) Field of Classification Search
CPC ............................... H05K 1/115; H05K 1/116
USPC .......................................... 716/137; 702/107
See application file for complete search history.

(56) References Cited

U.S. PATENT DOCUMENTS

| | | | |
|---|---|---|---|
| 6,062,916 A | | 5/2000 | Gladd et al. |
| 6,064,285 A | | 5/2000 | Harron et al. |
| 6,933,800 B2 | | 8/2005 | Wallace, Jr. et al. |
| 2001/0000403 A1 | * | 4/2001 | Gaisford et al. ............. 219/748 |
| 2002/0053898 A1 | * | 5/2002 | Ademian et al. ........... 324/76.19 |
| 2002/0057171 A1 | * | 5/2002 | Patel et al. ..................... 336/200 |
| 2002/0108933 A1 | * | 8/2002 | Hoffman et al. ......... 219/121.43 |
| 2003/0071671 A1 | * | 4/2003 | Krontz et al. .................. 327/276 |
| 2003/0142513 A1 | * | 7/2003 | Vinciarelli ....................... 363/17 |
| 2004/0054426 A1 | * | 3/2004 | Anthony ........................... 700/1 |
| 2005/0130480 A1 | * | 6/2005 | Zhang ........................... 439/342 |
| 2005/0255812 A1 | * | 11/2005 | Na et al. ........................... 455/78 |
| 2006/0139131 A1 | * | 6/2006 | Asano ............................ 333/263 |
| 2006/0185890 A1 | | 8/2006 | Robinson |
| 2007/0152771 A1 | * | 7/2007 | Shan et al. ....................... 333/33 |
| 2007/0244684 A1 | * | 10/2007 | Murugan et al. ................ 703/14 |
| 2007/0285190 A1 | * | 12/2007 | Mukaiyama et al. .......... 333/161 |
| 2008/0160681 A1 | * | 7/2008 | Anthony et al. ............... 438/129 |
| 2009/0049414 A1 | * | 2/2009 | Mutnury et al. ................... 716/2 |

(Continued)

OTHER PUBLICATIONS

Gustafson, T.K., "Stub Tuning" Lecture Notes EE117, Fall 2006, University of California, Berkeley, 5 pgs. <http://inst.eecs.berkeley.edu/~ee117/fa06/lectures/lecture10double%20stub.pdf>.

(Continued)

*Primary Examiner* — Chae Ko
(74) *Attorney, Agent, or Firm* — Larson Newman, LLP

(57) ABSTRACT

An information handling system includes a printed circuit board (PCB) including a signal path with a trace coupled to a source, another trace coupled to a load, a tuned stub, and a via connecting the traces and the tuned stub. A method includes providing a signal path on a PCB with a trace coupled to a source, a trace coupled to a load, a tuned stub, and a via connecting the traces and the tuned stub, driving a signal on the signal path, and adjusting the tuned stub length so that the signal is unchanged between the source and the load. A PCB includes a signal path between a source and a load with two traces and a via, and a tuned path between the source and the load with the two traces, another trace, and the via, the length of the tuned path being a half wavelength stub.

20 Claims, 7 Drawing Sheets

(56) References Cited

U.S. PATENT DOCUMENTS

2009/0151989 A1* 6/2009 Hunrath .................. 174/257
2009/0295498 A1* 12/2009 Shan et al. ................. 333/33
2010/0019870 A1* 1/2010 Seino et al. ............... 333/24 C

OTHER PUBLICATIONS

Gisin, Franz et al. "Overview of Backdrilling" Sanmina-SCI, Feb. 2007, 5 pgs. <http://www.sanmina-sci.com/Solutions/pdfs/pcbres/Backdrilling.pdf>.

* cited by examiner

SYSTEM AND METHOD FOR STUB TUNING IN AN INFORMATION HANDLING SYSTEM

FIELD OF THE DISCLOSURE

This disclosure relates generally to an information handling system, and relates more particularly to signal integrity in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software resources that may be configured to process, store, and communicate information and may include one or more computer systems, data storage systems, and networking systems.

Information handling systems are often implemented using a printed circuit boards (PCB). A PCB includes interconnected components of the information handling system in a form that is convenient to manufacture, assemble into larger devices and operate. A PCB typically includes several circuit trace levels laminated together with a rigid material. Vias are drilled in the PCB at locations where the traces in different layers overlap, and the vias are then filled with a conductive material. In this way, circuit paths between components on the PCB are created.

Where the traces in a circuit path are on the top and bottom sides of the PCB, the via interconnecting the traces forms a continuous portion of the circuit path. Where one of the traces is in an inner layer of the PCB, a portion of the interconnecting via can form an open circuit stub, which introduces a discontinuity into the circuit path. Discontinuities in a circuit path cause reduced signal integrity at a signal load, and lead to reduced bit error rates and device failures. The problem only becomes worse as the speed of information handling systems increases.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
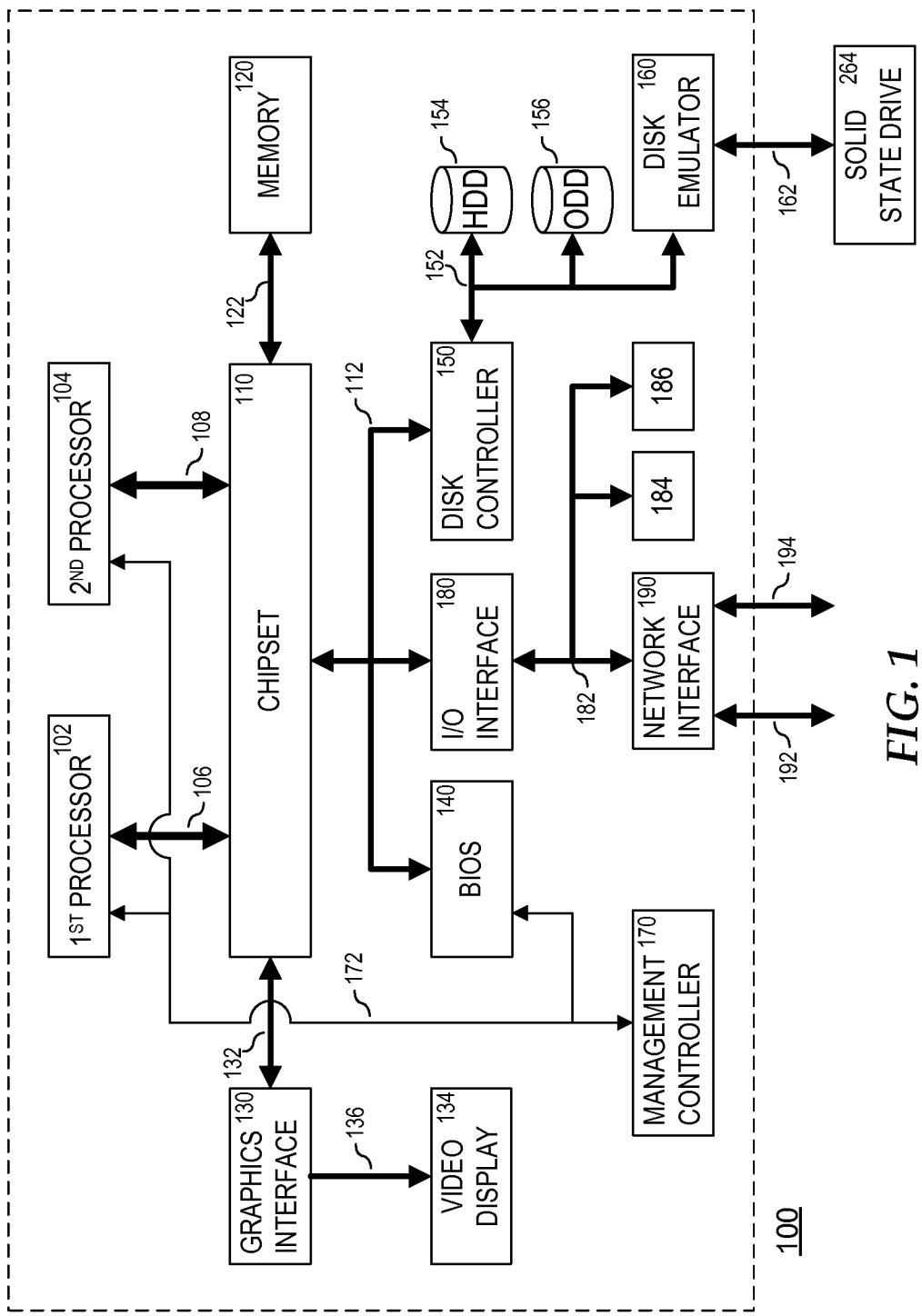
FIG. 1 illustrates a functional block diagram of an exemplary embodiment of an information handling system.

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

For purposes of this disclosure, an information handling system can include any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a personal data assistant (PDA), a consumer electronic device such as a portable music player, a portable DVD player, or a digital video recorder (DVR), a network server or storage device, a switch router, a wireless router, or another network communication device, or any other suitable device, and can vary in size, shape, performance, functionality, and price. An information handling system can also include a set of any of the foregoing devices.

The information handling system can include memory (volatile (e.g. random access memory (RAM), etc.), nonvolatile (read only memory (ROM), flash memory, etc.), or any combination thereof), one or more processing resources, such as a central processing unit (CPU), hardware, firmware, or software control logic, or any combination thereof. Additional resources of the information handling system can include one or more storage devices, one or more communications ports for communicating with external devices, as well as various input and output (I/O) devices, such as a keyboard, a mouse, a video display, or any combination thereof. The information handling system can also include one or more buses operable to transmit communications between the various hardware resources. Portions of an information handling system may themselves be considered information handling systems.

Portions of an information handling system, when referred to as a "device", a "module", or the like, may be configured as hardware, firmware, software, or any combination thereof. For example, a device or a module may be hardware. A non-limiting example of a device or a module implemented as hardware includes: an integrated circuit (e.g., an Application Specific Integrated Circuit (ASIC), a Field Programmable Gate Array (FPGA), a structured ASIC, or a device embedded on a larger chip), a card (e.g., a Peripheral Component Interface (PCI) card, a PCI-express card, a Personal Computer Memory Card International Association (PCMCIA) card, or other such expansion card), or a system (e.g., a motherboard, a system-on-a-chip (SoC), or a stand-alone device). Similarly, the device or module can be firmware (i.e., any software running on an embedded device, a Pentium class or PowerPC™ brand processor, or other such device) or software (i.e., any software capable of operating in the relevant environment). The device or module can also be a combination of any of the foregoing examples of hardware, firmware, or software. Note that an information handling system can include an integrated circuit or a board-level product having portions thereof that can also be any combination of hardware or software.

Devices or programs that are in communication with one another need not be in continuous communication with each other, unless expressly specified otherwise. In addition, devices or programs that are in communication with one another may communicate directly or indirectly through one or more intermediaries.

Embodiments discussed below describe, in part, distributed computing solutions that manage all or part of a communicative interaction between network elements. A network element may be a node, a piece of hardware, software, firmware, middleware, another component of a computing system, or any combination thereof. In this context, a communicative interaction may be intending to send information, sending information, requesting information, receiving information, receiving a request for information, or any combination thereof. As such, a communicative interaction could be unidirectional, bi-directional, multi-directional, or any combination thereof. In some circumstances, a communicative interaction could be relatively complex and, involve two or more network elements. For example, a communicative interaction may be "a conversation," or series of related communications between a client and a server—each network element sending and receiving information to and from the other. Whatever form the communicative interaction takes, the network elements involved need not take any specific form.

In the description below, a flow-charted technique may be described in a series of sequential actions. The sequence of the actions, and the party performing the steps may be freely changed without departing from the scope of the teachings. Actions may be added, deleted, or altered in several ways. Similarly, the actions may be re-ordered or looped. Further, although processes, methods, algorithms, or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features, but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and resources described herein. This is done merely for convenience, and to give a general sense of the scope of the invention. This description should be read to include one, or at least one, and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only, and not intended to be limiting.

To the extent not described herein, many details regarding specific materials, processing acts, and circuits are conventional, and may be found in textbooks and other sources within the computing, electronics, and software arts.

An information handling system and method of using it are described below. An exemplary, non-limiting system description is described before addressing methods of using it. Some of the functionality of modules within the system is described with the system. The utility of the system and its modules will become more apparent with the description of the methods that follow the description of the system and modules.

FIG. 1 illustrates a functional block diagram of an exemplary embodiment of an information handling system, generally designated as 100. The information handling system 100 can include a processor 102 coupled to a host bus 106, and can further include one or more additional processors, generally designated as an $n^{th}$ processor 104, coupled to a host bus 108. The processor 102 can be coupled to a chipset 110 via the host bus 106 and the $n^{th}$ processor 104 can be coupled to the chipset 110 via the host bus 108. The chipset 110 can support the processors 102 through 104, allowing for simultaneous processing by the processors 102 through 104, and can support the exchange of information within the information handling system 100 during multiple processing operations. In an aspect, the chipset 110 can function to provide access to the processor 102 using host bus 106, and the $n^{th}$ processor 104 using the host bus 108. In another aspect, the chipset 110 can include a dedicated bus (not illustrated) to transfer data between the processor 102 and the $n^{th}$ processor 104.

The information handling system 100 can include a memory 120 coupled to a memory bus 122. In accordance with an aspect, the chipset 110 can be referred to as a memory hub or a memory controller, where the memory 120 can be coupled to the chipset 110 via the memory bus 122. For example, the chipset 110 can include an Accelerated Hub Architecture (AHA) enabled-chipset that can include a memory controller hub and an I/O controller hub. As a memory controller hub, the chipset 110 can be coupled to the host buses 106 through 108, and the memory bus 122 as individual buses, or as part of the same bus (not illustrated). The chipset 110 can also provide bus control and can handle transfers between the host buses 106 through 108, and the memory bus 122. In accordance with another aspect (not illustrated), the information handling system can include a separate memory dedicated to each processor 102 through 104. Each memory can include a memory bus coupled between each processor 102 through 104 and its dedicated memory. In accordance with yet another aspect, the chipset 110 can be generally considered an application specific chipset that provides connectivity to various buses, and integrates other system functions. For example, the chipset 110 can be provided using a chipset that includes two parts: a Graphics and Memory Controller Hub (GMCH) and an I/O Controller Hub (ICH). The chipset 110 can also be packaged as an ASIC.

The information handling system 100 can also include a graphics interface 130 that can be coupled to the chipset 110 using the graphics bus 132. The graphics interface 130 can provide a video display output 136 to the video display 134. In one form, the graphics interface 130 can be an Accelerated Graphics Port (AGP) interface to display content within a video display 134. Other graphics interfaces (not illustrated) may also be used in addition to the graphics interface 130 if needed or desired. The video display 134 can include one or more types of video displays, such as a flat panel display or other type of display device.

The information handling system 100 can also include an I/O channel 112 connected to the chipset 110. The I/O channel 112 can include a Peripheral Component Interconnect (PCI) bus, a PCI-Extended (PCI-X) bus, a high-speed link of PCI-Express (PCIe) lanes, another industry standard or proprietary bus or link, or any combination thereof. In one embodiment, a PCI bus can be operated at approximately 66 MHz, a PCI-X bus can be operated at approximately 133 MHz, and a PCIe link can be operated at approximately 250 million bytes per second (MB/s) per lane in each direction. PCI buses, PCI-X buses, and PCIe links can be provided to comply with industry standards for connecting and communicating between various PCI, PCI-X and PCIe enabled hardware devices, respectively. The chipset 110 can include other buses in association with, or independent of, the I/O channel 112, including other industry standard buses (e.g., Industry Standard Architecture (ISA), Small Computer Serial Interface (SCSI), Inter-Integrated Circuit ($I^2C$), System Packet Interface (SPI), or Universal Serial Bus (USB), proprietary buses or any combination thereof.

In an alternate embodiment, the chipset 110 can be a chipset employing a Northbridge/Southbridge chipset configuration (not illustrated). For example, a Northbridge portion of the chipset 110 can communicate with the processors 102 through 104 using the host buses 106 through 108, and can control interaction with the memory 120, the I/O channel 112, and activities for the video graphics interface 130. The chipset 110 can also include a Southbridge portion (not illustrated) of the chipset 110, and can handle I/O functions of the chipset 110. The Southbridge portion can manage basic forms of I/O, such as USB, serial I/O, audio outputs, Integrated Drive Electronics (IDE), ISA I/O, or any combination thereof for the information handling system 100.

The information handling system 100 can also include a basic input/output system (BIOS) module 140 that can be coupled to the I/O channel 112. The BIOS module 140 can include BIOS code operable to detect and identify resources within the information handling system 100, provide the appropriate drivers for those resources, initialize those resources, and access those resources.

The information handling system 100 can further include a disk controller 150 coupled to the I/O channel 112. The disk controller 150 can include a disk interface 152 that can include other industry standard buses (e.g., Integrated Drive Electronics (IDE), Parallel Advanced Technology Attachment (PATA), Serial Advanced Technology Attachment (SATA), SCSI, or USB or proprietary buses, or any combination thereof. The disk controller 150 can be coupled to one or more disk drives via the disk interface 152. Such disk drives include a hard disk drive (HDD) 154 or an optical disk drive (ODD) 156 (e.g., a Read/Write Compact Disk (R/W-CD), a Read/Write Digital Video Disk (R/W-DVD), a Read/Write mini Digital Video Disk (R/W mini-DVD), or another type of optical disk drive), or any combination thereof. The optical disk drive 166 can read a removable data storage medium (e.g., a Compact Disk (CD), a Digital Video Disk (DVD), a mini Digital Video Disk (mini-DVD), or other optical media). Additionally, the information handling system 100 can include a disk emulator 160 that is coupled to the disk interface 152. The disk emulator 160 can permit a solid-state drive 164 to be coupled to the information handling system 100 via an external interface 162. The external interface 162 can include other industry standard busses (e.g., USB or IEEE 1394 (Firewire)) or proprietary busses, or any combination thereof. Alternatively, the solid-state drive 164 can be disposed within the information handling system 100.

The information handling system 100 can further include a management controller 170 that can be coupled to the chipset 110 via a system communication bus 172, such as a control bus. The management controller 170 may be on a main circuit board (e.g., a baseboard, a motherboard, or any combination thereof), integrated onto another component such as the chipset 110, in another suitable location, or any combination thereof. Although not illustrated, another resource, such as the processors 102 or 104, the memory 120, the graphics interface 130, the video display 134, the I/O interface 140, or the disk controller 150, or any combination thereof, can be coupled to the management controller 170. Commands, communications, or other signals may be sent to or received from the management controller 170 by any one or any combination of resources previously described. The management controller 170 can be part of an integrated circuit or a chip set within the information handling system 100.

The information handling system 100 can also include an I/O interface 180 that can be connected to the chipset 110 via the I/O channel 112. The I/O interface 180 can be coupled to a peripheral channel 182 that can be of the same industry standard or proprietary bus or link architecture as the I/O channel 112, or of a different industry standard or proprietary bus or link architecture than the I/O channel 112. As such, the I/O interface 180 can extend the I/O channel 112 capacity when the peripheral channel 182 is the same as the I/O channel 112, or translate information from a type suitable to the industry standard or proprietary bus or link architecture of the I/O channel 112 to a type suitable to a different industry standard or proprietary bus or link architecture, and vise versa, when the peripheral channel 182 is different than the I/O channel 182. Other I/O interfaces (not illustrated) may also be used in addition to the I/O interface 180, if needed or desired.

The peripheral channel 182 can include a bus structure that allows the installation and coupling of additional resources 184 through 186 to the information handling system. In accordance with an aspect (not illustrated), the peripheral channel 182 can also include one or more point-to-point links to the additional resources 184 through 186. The external resources 184 through 186 can include a data storage system, a graphics interface, another suitable resource or any combination thereof. The additional resources 184 through 186 can be on a main circuit board, on separate circuit boards or add-in cards disposed within the information handling system 100, devices that are external to the information handling system 100, or any combination thereof.

The information handling system 100 can also include a network interface device 190 that is coupled to the I/O interface 180 via the peripheral channel 182. The network interface device 190 may be a network interface card (NIC) disposed within the information handling system 100, on a main circuit board (e.g., a baseboard, a motherboard, or any combination thereof), integrated onto another component such as the chipset 110, in another suitable location, or any combination thereof. The network interface device 190 can include network channels 192 and 194. The network interface device 190 can also include additional network channels (not illustrated). In accordance with an aspect, the network channels 192 and 194 are of a different industry standard or proprietary bus or link architecture than the peripheral channel 182, and the network interface device 190 can translate information from a type suitable to the industry standard or proprietary bus or link architecture of the peripheral channel 182 to a type suitable to the industry standard or proprietary bus or link architecture of the network channels 192 and 194, and vise versa. The network channels 192 and 194 can be of industry standard architecture (e.g., InfiniBand, Fibre Channel, Gb Ethernet, etc.), proprietary channel architecture, or any combination thereof. Other network interface devices (not illustrated) may also be used in addition to the network interface device 190, if needed or desired. The network channels 192 and 194 can be coupled to network resources (not illustrated). The network resource can include another information handling system, a data storage system, another network, a grid management system, another suitable resource or any combination thereof.

An information handling system 100 can be implemented wholly or in part on a printed circuit board (PCB). A PCB includes interconnected components in an information handling system 100. Components of the information handling system, such as integrated circuit devices (e.g., the processors 102 and 104, the chipset 110, etc.), discrete elements (e.g., transistors, resistors, capacitors, inductors, etc.), or sub-assemblies (e.g., connectors, displays, etc.) may be mechanically attached to a PCB. The mechanical attachments can also function as electrical connections. The interconnections between the components (e.g., the host busses 106 and 108, the memory bus 122, the system communication bus 172, etc.) can be created by forming metal traces on the surface and in layers within the PCB. The metal traces on different layers are connected by vias filled with a conductive material to form signal paths between the components. In a particular embodiment, a metal trace can also be embedded within the PCB.

The signal paths provide electrical connections between the components of the information handling system 100, where a signal source of a first component sends an information signal to a signal load of a second component. An interconnection between the components of the information handling system 100 includes information signals of different types, including component power, data signals, control signals, clock signals, other signals, or any combination thereof. Thus, a PCB can include a multitude of separate signal paths.

Figure 2:
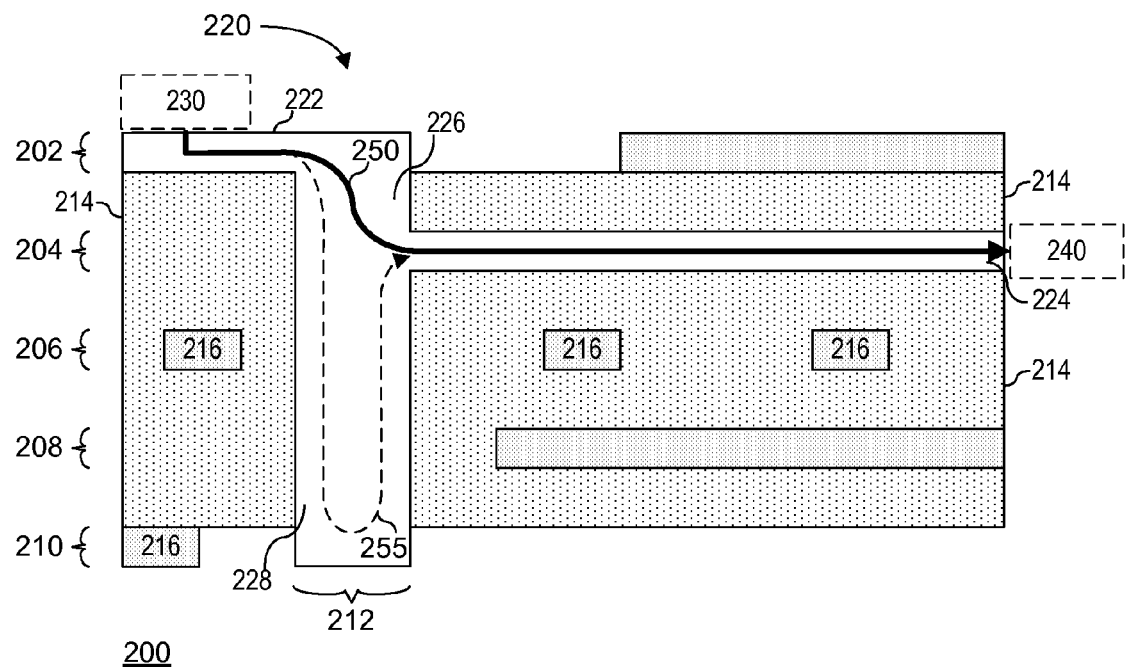
FIG. 2 illustrates a cross section of a printed circuit board in the information handling system.

FIG. 2 illustrates a cross section of a PCB 200 in the information handling system 100. The PCB 200 includes trace levels 202, 204, 206, 208, and 210, and a via 212. The trace levels 202 and 210 are on the top and bottom surfaces of the PCB 200, respectively, and the trace levels 204, 206, and 208 are encased within the PCB by a rigid resin material 214. The via 212 is drilled vertically through the PCB 200, and, when filled with a conductive material, provides an electrical connection between the trace levels 202 through 210. Other traces 216 are shown within the trace levels 202 through 210.

The PCB 200 includes a signal path 220 between a signal source 230 and a signal load 240. The signal path 220 includes a trace 222 in the trace level 202, a trace 224 in the trace level 204, a via section 226 between the traces 222 and 224, and a via stub 228. An information signal from the signal source 230 is communicated along the signal path 220 to the signal load. The information signal is communicated along a desired signal path 250 that includes the trace 222, the via section 226, and the trace 224. The information signal is also communicated along an undesired signal path 255 that includes the trace 222, the via section 226, the via stub 228, and the trace 224. The via stub 228 behaves as an open circuit stub, forming a voltage divider between the desired signal path 250 and the undesired signal path 255.

Figure 3:
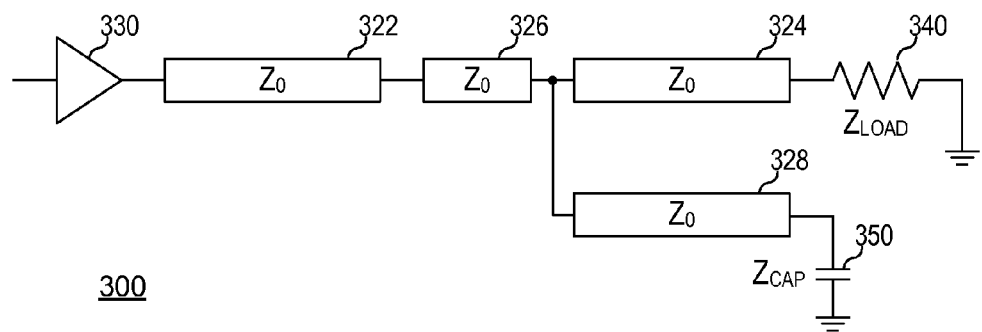
FIG. 3 illustrates an equivalent electrical model of a circuit path in the printed circuit board of FIG. 2.

FIG. 3 illustrates an equivalent electrical model 300 of the signal path 220. The electrical model 300 includes impedance elements 322, 324, 326, and 328, a signal source 330, a signal load 340, and an effective capacitor 350. The signal source 330 includes an input and an output. The impedance element 322 includes an input connected to the output of the signal source 330, and an output. The impedance element 326 includes an input connected to the output of the impedance element 322, and an output. The impedance element 324 includes an input connected to the output of the impedance element 326, and an output. The signal load 340 includes an input connected to the output of the impedance element 324, and an output connected to a power ground. The impedance element 328 includes an input connected to the output of the impedance element 326, and an output. The capacitor 350 includes an input connected to the output of the impedance element 328, and an output connected to the power ground. The impedance elements 322 and 324 represent the impedance of the traces 222 and 224, respectively. The impedance element 326 represent the impedance of the via section 226. The impedance element 328 represent the impedance of the via stub 228. The effective capacitor 350 represents a parasitic capacitance between the via stub 228 and a ground plane of the PCB 200.

After reading this specification, skilled artisans will appreciate that the stub via 228, modeled by the impedance element 328 and the capacitor 350, forms a complex voltage divider that introduces a frequency dependent loss in an information signal sent from the signal source 330. The impedance of the stub via 228 ($Z_{IN}$) is given as:

$$Z_{IN} = \frac{Z_0(Z_{CAP} + jZ_0\tan(\omega T_{VIA}))}{Z_0 + jZ_{CAP}\tan(\omega T_{VIA})} \quad [1]$$

where $Z_0$ is the characteristic impedance of the impedance elements 322 through 328 (e.g., typically 50 ohms), $\omega$ is the frequency, $T_{VIA}$ is the time for an information signal to propagate along the via stub 228 and back, and $Z_{CAP}$ is given as:

$$Z_{CAP} = \frac{1}{j\omega C} \quad [2]$$

where C is the parasitic capacitance between the via stub 228 and the ground plane.

Figure 4:
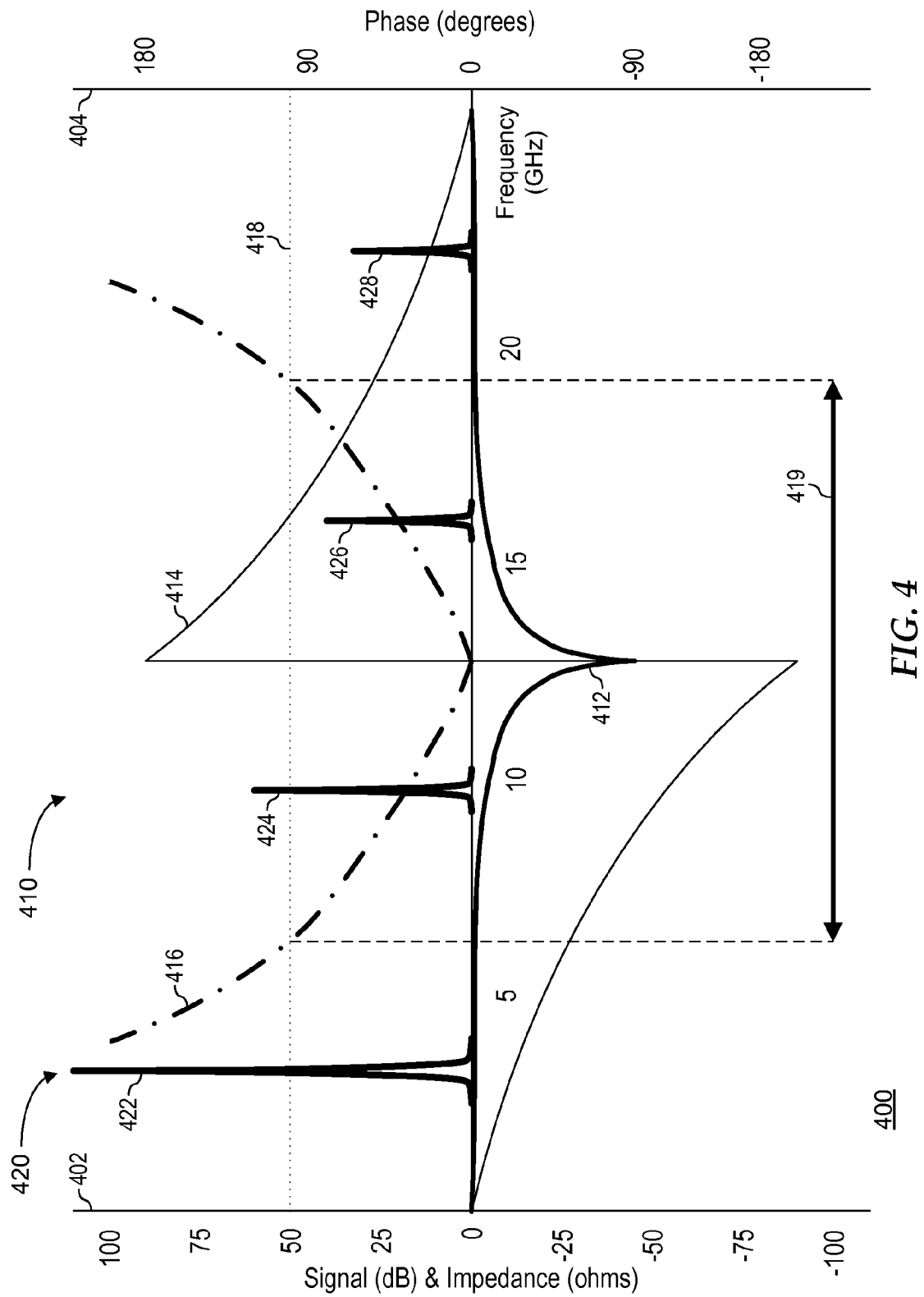
FIG. 4 illustrates an example of a frequency response graph for the electrical model of FIG. 3.

FIG. 4 illustrates an example of a frequency response graph 400 for the electrical model 300. The frequency response graph 400 shows a signal strength in decibels (dB) and an impedance in ohms on the left y-axis 402, and a phase shift in degrees on the right y-axis 404, versus frequency in giga-Hertz (GHz) on the x-axis 406. The frequency response graph 400 includes the frequency response 410 of the via stub 228, and an example of an information signal 420. The frequency response 410 includes an attenuation curve 412, a phase curve 414, and an impedance curve 416. Note that, where the impedance falls below 50 ohms, as indicated by the horizontal marker 418, that is, for information signals with frequency components between about 6-19 GHz, as indicated by the horizontal marker 419, the attenuation curve 412 show attenuation of the information signal that is greater than 1 dB, and the phase curve 414 shows a phase shift of the information signal that is greater than 50 degrees.

For example, consider the information signal 420, that is substantially a square wave signal with a fundamental component 422 at 3.2 GHz, a third harmonic component 424 at 9.6 GHz, a fifth harmonic component 426 at 16.0 GHz, and a seventh harmonic component 428 at 22.4 GHz. For the fundamental component 422 and the seventh harmonic component 428, the attenuation is less than about 1 dB, and the phase shift is less than about 25 degrees. However, for the third harmonic component 424 and the fifth harmonic component 426, the attenuation is about 4 dB, and the phase shift is about 100 degrees. A non-limiting example of such a signal in an information handling system includes a system clock signal, a bus clock signal, a reference oscillator signal, a wireless communication signal, or another periodic signal.

Figure 5:
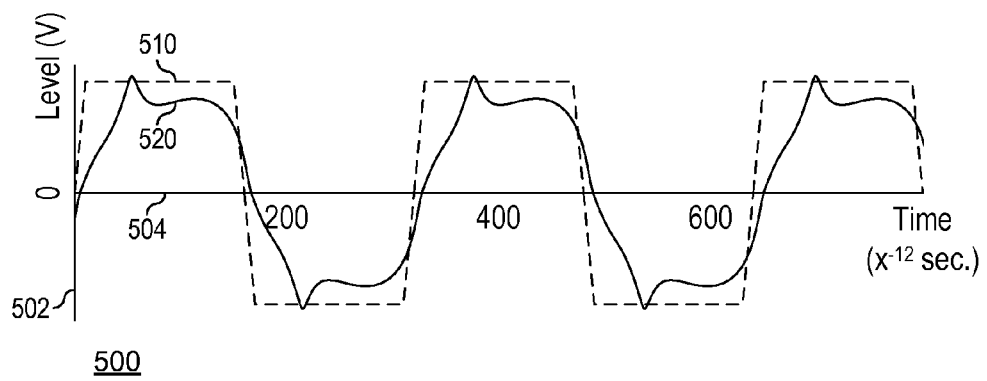
FIG. 5 illustrates an example of an information signal graph for the electrical model of FIG. 3.

FIG. 5 illustrates an example of an information signal graph 500 for the electrical model 300. The information signal graph 500 shows a signal level in volts (V) on the y-axis 502, versus time in pico-seconds (p-sec) on the x-axis 506. The information signal graph 500 includes an illustration of the information signal 420 as measured at the signal source 330, referred to as the source signal, and labeled 510. The information signal graph 500 also includes an illustration of the information signal 420 as measured at the signal load 340, referred to as the load signal, and labeled 520. The frequency dependent loss introduced by the stub via 228 causes a slow rise time and ringing in the load signal 520, as compared to the source signal 510. In other words, the signal integrity of the information signal 420 is reduced by the open circuit stub created by the via stub 228.

Signal paths between components of an information handling system 100 can include more than one transition between trace levels and more than one via to connect the traces. This means that a typical signal path can include more than one via stub, and more than one point where loss and phase distortion are introduced to an information signal. In such cases, the information signal can degrade to a point that information is not accurately received by the signal load component, resulting in increased bit error rates and failures. In an embodiment of the present disclosure, the length of the via stubs in a signal path are altered to tune the frequency response in order to improve the signal integrity at the signal load.

Figure 6:
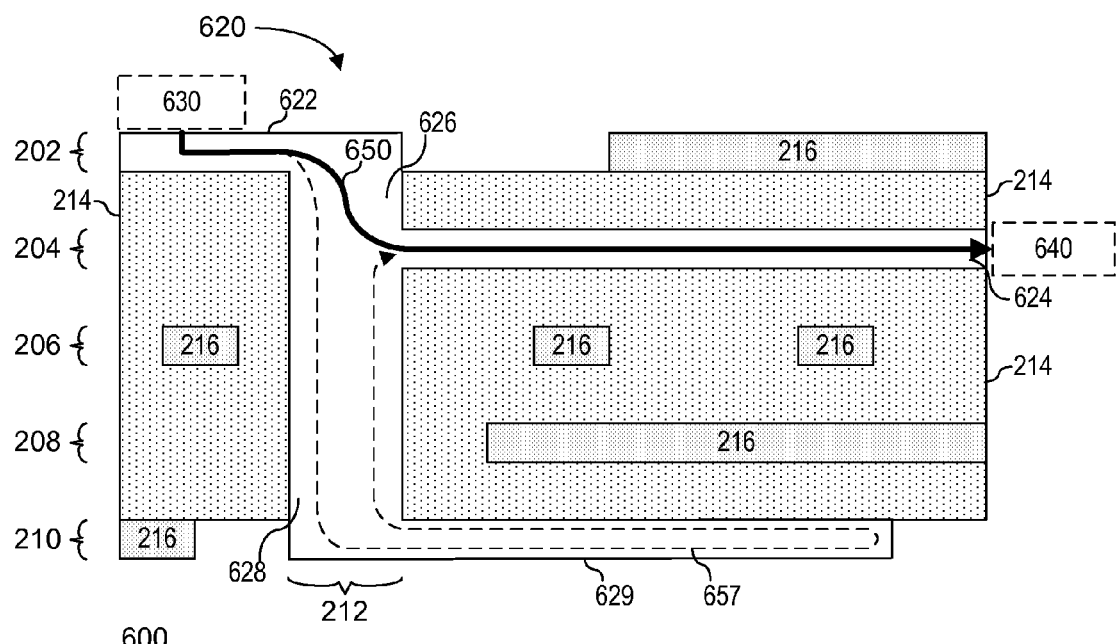
FIG. 6 illustrates a cross section of a printed circuit board in the information handling system in accordance with an embodiment of the present disclosure.

FIG. 6 illustrates a cross section of a PCB 600 in the information handling system 100, in accordance with an embodiment of the present disclosure. The PCB 600 includes the trace levels 202 through 210, the via 212, the rigid resin material 214, and the other traces 216. The PCB 600 also includes a signal path 620 between a signal source 630 and a signal load 640. The signal path 620 includes traces 622 and 624 in the trace level 204, a via section 626, a via stub 628, and a trace stub 629. An information signal from the signal source 630 is communicated along the signal path 620 to the signal load. The information signal is communicated along a desired signal path 650 that includes the traces 622 and 624, and the via section 626. The information signal is also communicated along a tuned signal path 657 that includes the traces 622 and 624, the via section 626, the via stub 628, and trace stub 629. The via stub 628 and the trace stub 629 behave as an open circuit stub, forming a voltage divider between the desired signal path 650 and the tuned signal path 657. The trace stub 629 is designed to have a length such that the total length of the via stub 628 and the via trace 629 is substantially equal to one half the wavelength of the fundamental frequency of the information signal communicated on the signal path 620.

Figure 7:
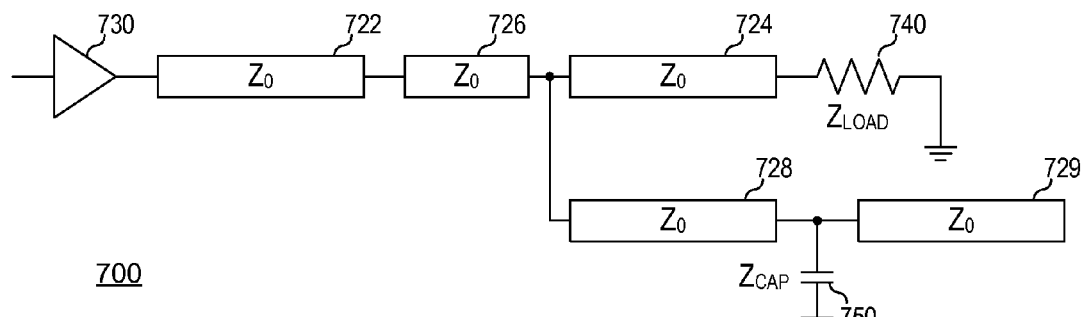
FIG. 7 illustrates an equivalent electrical model of a circuit path in the printed circuit board of FIG. 6.

FIG. 7 illustrates an equivalent electrical model 700 of the circuit path 720. The electrical model 700 includes impedance elements 722, 724, 726, 728, and 729, a signal source 730, a signal load 740, and an effective capacitor 750. The signal source 730 includes an input and an output. The impedance element 722 includes an input connected to the output of the signal source 730, and an output. The impedance element 726 includes an input connected to the output of the impedance element 722, and an output. The impedance element 724 includes an input connected to the output of the impedance element 726, and an output. The signal load 740 includes an input connected to the output of the impedance element 724, and an output connected to a power ground. The impedance element 728 includes an input connected to the output of the impedance element 726, and an output. The capacitor 750 includes an input connected to the output of the impedance element 728, and an output connected to the power ground. The impedance element 727 includes an input connected to the output of the impedance element 728. The impedance elements 722 and 724 represent the impedance of the traces 622 and 624, respectively. The impedance element 726 represent the impedance of the via section 626. The impedance element 728 represent the impedance of the via stub 628. The impedance element 729 represent the impedance of the trace stub 629. The effective capacitor 750 represents a parasitic capacitance between the via stub 628 and a ground plane of the PCB 600.

After reading this specification, skilled artisans will appreciate that the stub via 628 and the stub trace 629, modeled by the impedance elements 728 and 729 and the capacitor 750, form a complex voltage divider that introduces a frequency dependent loss in an information signal sent from the signal source 730. The impedance of the stub via 628 in combination with the stub trace 629 ($Z_{IN-TRACE}$) is given as:

$$Z_{IN-TRACE} = \frac{Z_O\left(\frac{Z_{CAP}Z_{TRACE}}{Z_{CAP}+Z_{TRACE}} + jZ_0\tan(\omega T_{VIA})\right)}{Z_0 + j\frac{Z_{CAP}Z_{TRACE}}{Z_{CAP}+Z_{TRACE}} + \tan(\omega T_{VIA})} \quad [3]$$

where $Z_0$ is the characteristic impedance of the impedance elements 722 through 729 (e.g., typically 50 ohms), ω is the frequency, $T_{VIA}$ is the time for an information signal to propagate along the via stub 728 and back. $Z_{CAP}$ is given as:

$$Z_{CAP} = \frac{1}{j\omega C} \quad [4]$$

where C is the parasitic capacitance between the via stub 628 and the ground plane. $Z_{TRACE}$ is given as:

$$Z_{TRACE} = jZ_0\tan\left(\omega T_{TRACE} - \frac{\pi}{2}\right) \quad [5]$$

where $T_{TRACE}$ is the time for an information signal to propagate along the impedance element 729 and back. Here, the length of the impedance element 729 is designed such that:

$$\omega_{FUND}(T_{TRACE} + T_{VIA}) = \pi$$

where $\omega_{FUND}$ is the fundamental frequency of a periodic information signal. This corresponds with the total length of the via stub 628 and the via trace 629 being substantially equal to one half the wavelength of the fundamental frequency of the information signal communicated on the signal path 620.

Figure 8:
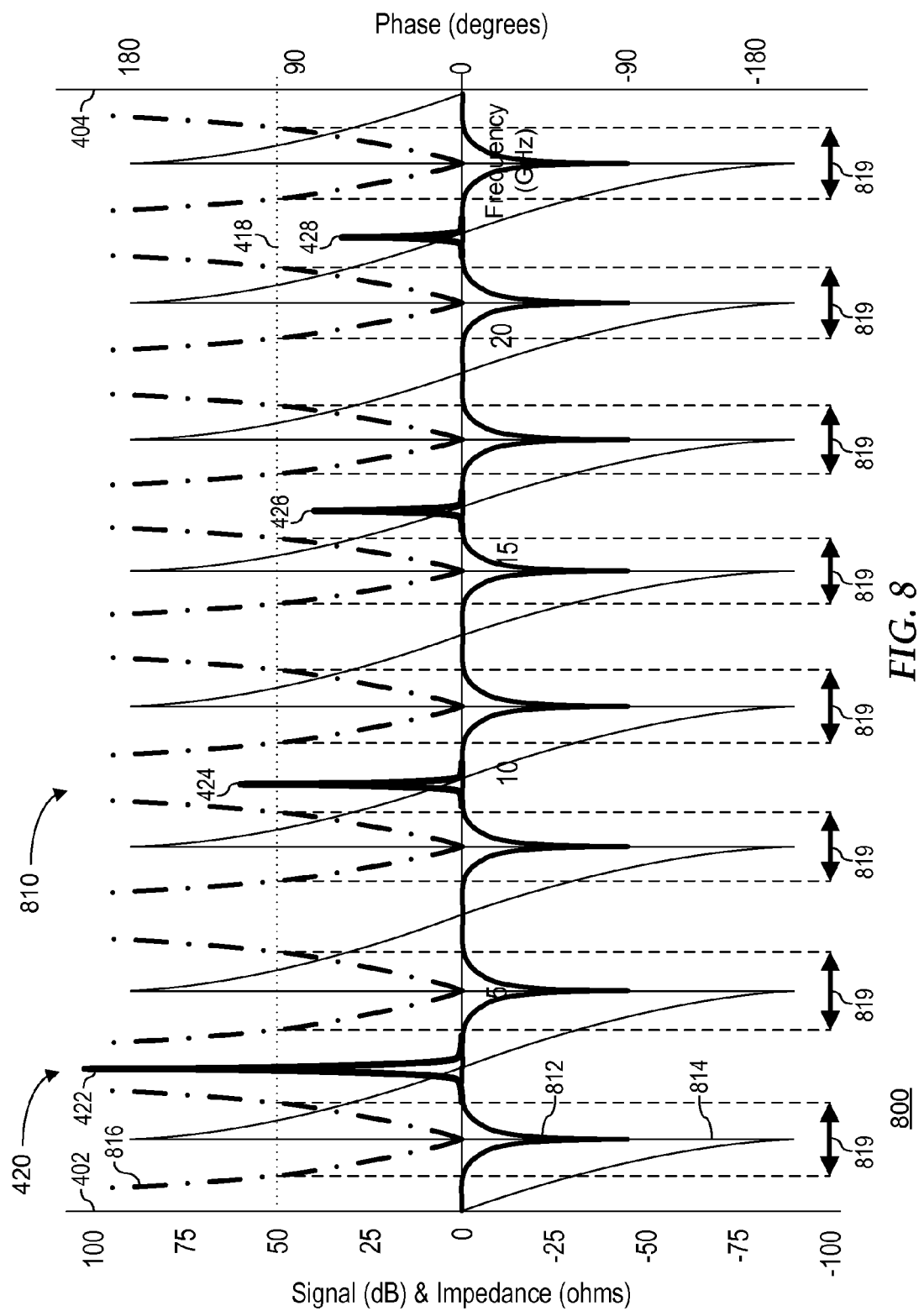
FIG. 8 illustrates an example of a frequency response graph for the electrical model of FIG. 7.

FIG. 8 illustrates an example of a frequency response graph 800 for the electrical model 700. The frequency response graph 800 shows a signal strength in decibels (dB) and an impedance in ohms on the left y-axis 402, and a phase shift in degrees on the right y-axis 404, versus frequency in gigaHertz (GHz) on the x-axis 406. The frequency response graph 800 includes the frequency response 810 of the via stub 628 in combination with the trace stub 629, and the information signal 420. The frequency response 810 includes an attenuation curve 812, a phase curve 814, and an impedance curve 816. Note that, where the impedance falls below 50 ohms, as indicated by the horizontal marker 418, that is, in the frequency ranges indicated by the horizontal markers 819, the attenuation curve 812 show attenuation of the information signal that is greater than 1 dB, and the phase curve 814 shows a phase shift of the information signal that is greater than 50 degrees.

Consider the information signal 420, the substantially square wave signal with the fundamental component 422, the third harmonic component 424, the fifth harmonic component 426, and the seventh harmonic component 428. Here, because the total length of the via stub 628 and the via trace 629 is substantially equal to one half the wavelength of the fundamental component 422, the attenuation and phase shift are negligible, as illustrated by the attenuation curve 812 and the phase curve 814, respectively. The same is also true for the third harmonic component 424, the fifth harmonic component 426, and the seventh harmonic component 428.

Figure 9:
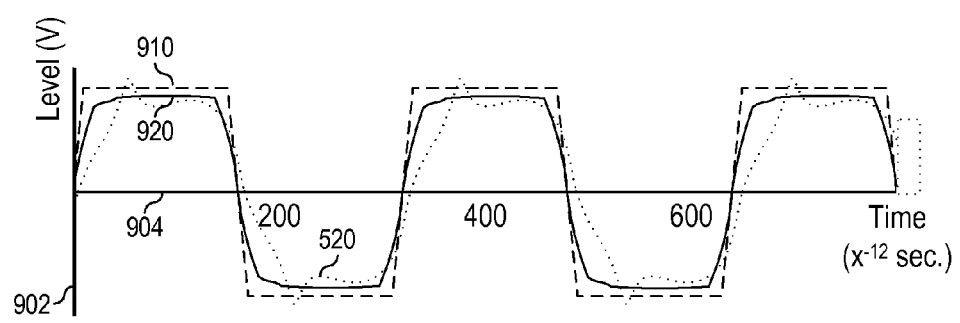
FIG. 9 illustrates an example of an information signal graph 900 for the electrical model of FIG. 7.

FIG. 9 illustrates an example of an information signal graph 900 for the electrical model 700. The information signal graph 900 shows a signal level in volts (V) on the y-axis 902, versus time in pico-seconds (p-sec) on the x-axis 906. The information signal graph 900 includes an illustration of the information signal 420 as measured at the signal source 730, referred to as the source signal, and labeled 510. The information signal graph 900 also includes an illustration of the information signal 920 as measured at the signal load 740, referred to as the load signal, and labeled 920. The rise time and ringing in the load signal 920 appears more similar to the source signal 510, and is an improvement over the load signal 520, illustrated for comparison. As such, the signal integrity of the via stub 628 in combination with the trace stub 628 is improved compared with the signal integrity of the via stub 228 alone.

Figure 10:
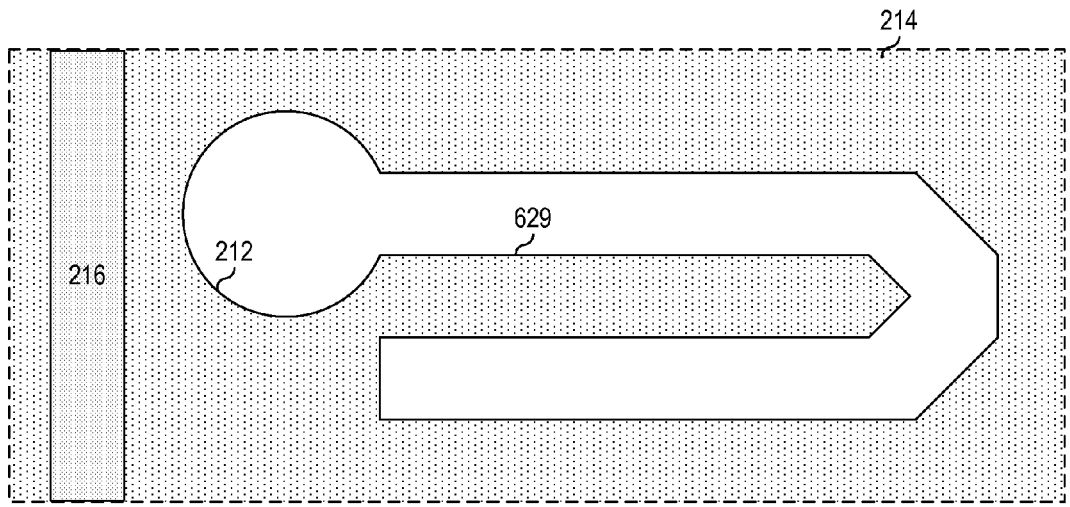
FIG. 10 illustrates a top view of the printed circuit board of FIG. 6.

A half-wave open circuit stub can also function as an antenna, emitting electromagnetic radiation, a potential effect of the addition of the trace stub 629 is to increase the unwanted electromagnetic interference into the information handling system 100. To mitigate this effect, the trace stub 629 can be formed in a "U" shape, folding the trace stub 629 in half to reduce unwanted emissions. FIG. 10 illustrates a top view of the PCB 600. The PCB shows the via 212, the rigid resin material 214, another trace 216, and the trace stub 629. The trace stub 629 is formed in a "U" shape to reduce unwanted emissions.

Figure 11:
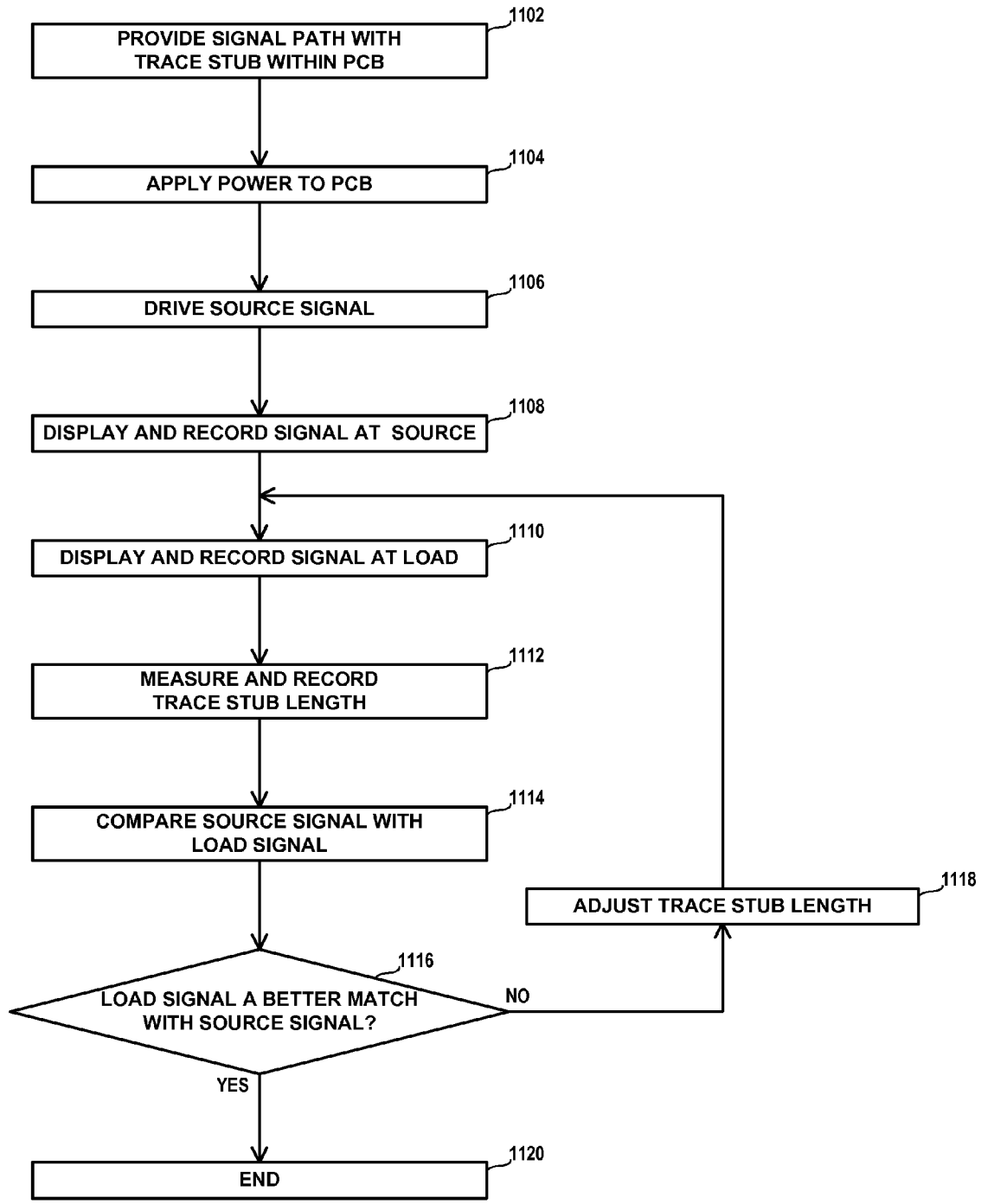
FIG. 11 illustrates a method of improving signal integrity in a printed circuit board in a flow chart form.

In an embodiment, the trace stub 629 is designed to be longer than half wavelength of the fundamental component 422. FIG. 11 illustrates a method of improving signal integrity in the PCB 600, as illustrated in FIG. 6, in a flow chart form. A signal path with a trace stub is provided within a PCB in block 1102. In an embodiment, the signal path 620 with trace stub 629 can be designed within a PCB 600 such that the total length of the via stub 628 and the trace stub 629 is longer than a half wavelength of the fundamental component 422 of an information signal 420, but less than a full wavelength. In a further embodiment, an information handling system 100 includes the PCB 600. Power is applied to the PCB in block 1104. For example, the PCB 600 can be tested after assembly, wherein test instrumentation can be connected to the signal path 620 to enable the display and recording of a source signal 910 at or near to a signal source 630, and of a load signal 920 at or near to a signal load 640. A source signal is driven along the signal path in block 1106. Here, the source signal 910 can be driven along the signal path 620 by the signal source 630. The source signal is displayed and recorded in block 1108. As such, the source signal 910 can be displayed recorded via the test instrumentation. A load signal is displayed and recorded in block 1110. For example, the load signal 920 can be displayed and recorded via the test instrumentation. The length of the trace stub is measured and recorded in block 1112. The length of the trace stub 629 can be measured on the surface of the PCB 600 and recorded. The recorded load signal is compared with the recorded source signal in block 1114.

A decision is made as to whether or not the load signal is a better match to the source signal in decision tree 1116. For example, the load signal 920 that more nearly resembles the source signal 910 can be determined as the better match. In another embodiment, criteria for determining a better match can be established in terms of load signal rise time, jitter, other criterion, or any combination thereof. If the load signal is not a better match to the source signal (i.e., the "No" branch of decision tree 1116), then the length of the trace stub is adjusted in block 1118, and the resulting load signal is displayed and recorded in block 1110. For example, the length of the trace stub 629 may be adjusted by an increment chosen to make a small but detectible change in the load signal 920. After reading this specification, skilled artisans will recognize various methods for adjusting trace lengths on a PCB may be employed. Skilled artisans will further recognize that the increment of adjustment will be determined with respect to the fundamental component frequency of an information signal on the signal path. If the load signal is a better match to the source signal (i.e., the "Yes" branch of decision tree 1116), then processing ends in block 1120.

In another embodiment, a signal path 620 is characterized by measuring the load signal 920 for various lengths of the trace stub 629. For example, a prototype PCB 600 can have the trace stub 629 length adjusted to shorter than would be the case for finding the better match between the source signal 910 and the load signal 920. Here, as the trace stub 629 length is shortened further, a still better match may be found between the source signal 910 and the load signal 920. At some point, shortening the stub trace 629 length still further can produce a worse match between the source signal 910 and the load signal 920. In this way, a trace stub 629 length that more nearly matches between the source signal 910 and the load signal 920 can be determined, and future revisions of the PCB 600 can be designed with the associated trace stub 629 length. Here, as described above, the criteria for determining better, worse or more nearly matching between the source signal 910 and the load signal 920 can include resemblance, rise time, jitter, other criterion, or any combination thereof.

In a first aspect, an information handling system includes a processor, a network interface component, and a PCB that has a signal path including a first trace in a first conductive layer that is coupled to a signal source, a second trace in a second conductive layer that is coupled to a signal load, a tuned stub in a third conductive layer, and a via interconnecting the first trace, the second trace, and the tuned stub. In an embodiment of the first aspect, the information handling system is configured such that the signal source can be communicated via the signal path to the signal load. In a further embodiment, the information handling system is configured such that information at the signal source includes a step function. In another embodiment, the information handling system is configured such that the information at the signal source includes a clock signal. In still another embodiment, the length of the tuned stub is chosen such that the length of the via between the second trace and the tuned stub plus the length of the tuned stub is substantially a half wavelength of a fundamental frequency of the step function. In yet another embodiment, the tuned stub is U-shaped. In another embodiment of the first aspect, the first conductive layer is on a first surface of the PCB. In a further embodiment, the third conductive layer is on a second surface of the PCB, and the second conductive layer is between the first conductive layer and the third conductive layer.

In a second aspect, a method includes providing a signal path on a PCB, where the signal path includes a first trace in a first conductive layer of the PCB that is coupled to a signal source, a second trace in a second conductive layer of the PCB that is coupled to a signal load, a tuned stub in a third conductive layer of the PCB, and a via connecting the first trace to the second trace and to the tuned stub. The method further includes driving a periodic signal on the signal path, and adjusting a length of the tuned stub such that a shape of the periodic signal is substantially unchanged between the signal source and the signal load. In an embodiment of the second aspect, the periodic signal comprises a step function. In a further embodiment, the periodic signal includes a system clock of the information handling system. In another embodiment of the second aspect, the length of the via between the second trace and the tuned stub plus the length of the tuned stub is chosen to be substantially a half wavelength of a fundamental frequency of the periodic signal. In a further embodiment, the method includes providing the tuned stub such that a first portion of the tuned stub is substantially parallel to a second portion of the tuned stub. In yet another embodiment of the second aspect, adjusting the length of the tuned stub further includes cutting the length of the tuned stub during a testing of the information handling system.

In a third aspect, a PCB includes a desired signal path between a signal source and a signal load, where the desired signal path includes a first trace in a first conductive layer, a second trace in a second conductive layer, and a via interconnecting the first trace and the second trace. The PCB also includes a tuned signal path between the signal source and the signal load, where the tuned signal path includes the first trace, the second trace, a third trace in a third conductive layer, and the via, where the via also interconnects the third trace with the first trace and the second trace, and where the length of the tuned signal path is chosen such that the tuned signal path is a half wavelength stub. In an embodiment of the third aspect, the PCB is operable to communicate an information packet from the signal source to the signal load, where the information packet traverses the desired signal path and the tuned signal path. In another embodiment, the PCB is further operable to communicate the information packet at a fundamental frequency. In yet another embodiment, the information packet includes a step function. In still another embodiment, the information packet includes clock information. In another embodiment of the third aspect, the third trace is U-shaped.

Note that not all of the activities described above in the general description or the examples are required, that a portion of a specific activity may not be required, and that one or more further activities may be performed, in addition to those described. Still further, the order in which activities are listed are not necessarily the order in which they are performed.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features described herein in the context of separate embodiments for the sake of clarity, may also be provided in combination in a single embodiment. Conversely, various features that are, for brevity, described in the context of a single embodiment, may also be provided separately, or in any sub-combination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur, or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a processor;
   a network interface component; and
   a printed circuit board (PCB) including a signal path comprising:

a first trace in a first conductive layer of the PCB, wherein the first trace is coupled to a signal source;

a second trace in a second conductive layer of the PCB, wherein the second trace is coupled to a signal load;

a tuned stub in a third conductive layer of the PCB; and a via through the first, second, and third conducting layers, and that interconnects the first trace, the second trace, and the tuned stub.

2. The information handling system of claim 1, wherein the information handling system is configured such that the signal source can be communicated via the signal path to the signal load.

3. The information handling system of claim 2, wherein the information handling system is configured such that information at the signal source comprises a step function.

4. The information handling system of claim 3, wherein the information handling system is configured such that the information at the signal source comprises a clock signal.

5. The information handling system of claim 3, wherein a length of the tuned stub is chosen such that the length of the via between the second trace and the tuned stub plus the length of the tuned stub is substantially a half wavelength of a fundamental frequency of the step function.

6. The information handling system of claim 5, wherein the tuned stub is U-shaped.

7. The information handling system of claim 1, wherein the first conductive layer is on a first surface of the PCB.

8. The information handling system of claim 7, wherein:
the third conductive layer is on a second surface of the PCB; and
the second conductive layer is between the first conductive layer and the third conductive layer.

9. A method, comprising:
providing a signal path on a printed circuit board (PCB), wherein the signal path comprises:
a first trace in a first conductive layer of the PCB, wherein the first trace is coupled to a signal source;
a second trace in a second conductive layer of the PCB, wherein the second trace is coupled to a signal load;
a tuned stub in a third conductive layer of the PCB; and
a via through the first, second, and third conducting layers, and that connects the first trace to the second trace and to the tuned stub;
driving a periodic signal on the signal path; and
adjusting a length of the tuned stub such that a shape of the periodic signal is substantially unchanged between the signal source and the signal load.

10. The method of claim 9, wherein the periodic signal comprises a step function.

11. The method of claim 10, wherein the periodic signal comprises a system clock of the information handling system.

12. The method of claim 9, wherein the length of the via between the second trace and the tuned stub plus the length of the tuned stub is chosen to be substantially a half wavelength of a fundamental frequency of the periodic signal.

13. The method of claim 12, further comprising providing the tuned stub such that a first portion of the tuned stub is substantially parallel to a second portion of the tuned stub.

14. The method of claim 9, wherein adjusting the length of the tuned stub further comprises cutting the length of the tuned stub during a testing of the information handling system.

15. A printed circuit board (PCB) comprising:
a desired signal path between a signal source and a signal load and comprising:
a first trace in a first conductive layer of the PCB;
a second trace in a second conductive layer of the PCB; and
a via interconnecting the first trace and the second trace;
a tuned signal path between the signal source and the signal load and comprising;
the first trace;
the second trace;
a third trace in a third conductive layer of the PCB; and
the via, wherein the via also interconnects the third trace with the first trace and the second trace; and
wherein:
the length of the tuned signal path is chosen such that the tuned signal path comprises a half wavelength stub; and
the via passes through the first, second, and third conducting layers.

16. The PCB of claim 15, operable to communicate an information packet from the signal source to the signal load, wherein the information packet traverses the desired signal path and the tuned signal path.

17. The PCB of claim 16, further operable to communicate the information packet at a fundamental frequency.

18. The PCB of claim 17, wherein the information packet comprises a step function.

19. The PCB of claim 18, wherein the information packet comprises clock information.

20. The PCB of claim 15, wherein the third trace is U-shaped.

* * * * *